(12) United States Patent
Fukasawa (10) Patent No.: US 7,491,977 B2
(45) Date of Patent: Feb. 17, 2009

(54) LIGHT EMITTING DIODE

(75) Inventor: Koichi Fukasawa, Kofu (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 637 days.

(21) Appl. No.: 11/048,880

(22) Filed: Feb. 3, 2005

(65) Prior Publication Data

US 2005/0167682 A1 Aug. 4, 2005

(30) Foreign Application Priority Data

Feb. 4, 2004 (JP) ............................. 2004-028325

(51) Int. Cl.
*H01L 33/00* (2006.01)
(52) U.S. Cl. .............................. 257/98; 257/81; 257/99; 257/E33.07; 257/E33.068
(58) Field of Classification Search .................. 257/81, 257/98, 99
See application file for complete search history.

(56) References Cited

U.S. PATENT DOCUMENTS 6,627,922 B1 * 9/2003 Ishinaga ....................... 257/99
2002/0123163 A1 * 9/2002 Fujii ............................ 438/26

FOREIGN PATENT DOCUMENTS

JP 2002-368281 12/2002

* cited by examiner

*Primary Examiner*—Dao H. Nguyen
(74) *Attorney, Agent, or Firm*—Browdy and Neimark, PLLC (57) ABSTRACT

An LED comprises: a chip substrate formed with a die bond pattern and electrode terminals; an LED chip mounted on the chip substrate; a reflective frame arranged on the chip substrate to enclose a circumference of the LED chip and having an opening at a part of its side walls and on an upper surface; reflecting surfaces formed on inner circumferential surfaces of the side walls of the reflective frame; a light transmissive resin body formed in the reflective frame and using the opening in the side wall as a light emission face; and a reflecting film covering an upper surface of the light transmissive resin body exposed on an upper surface side of the reflective frame; wherein light produced by the LED chip is reflected by a reflecting surface of the refractive frame and by the reflecting film and is emitted outward from the light emission face. The side emission type LED of this construction can be reduced in thickness for surface mounting and can illuminate a small-width side surface of a liquid crystal panel with high efficiency.

12 Claims, 8 Drawing Sheets

LIGHT EMITTING DIODE

CROSS REFERENCE TO RELATED APPLICATION

The application claims the priority benefit of Japanese Patent Application No. 2004-28325, filed on Feb. 4, 2004, the entire description of which is incorporated herein by reference.

BACKGROUND OF THE INVENTION

1. Field of the Invention

The present invention relates to a light emitting diode (LED) of a side emission type that illuminates a thin display body such as a liquid crystal panel from its side.

2. Description of Related Art

Figure 12:
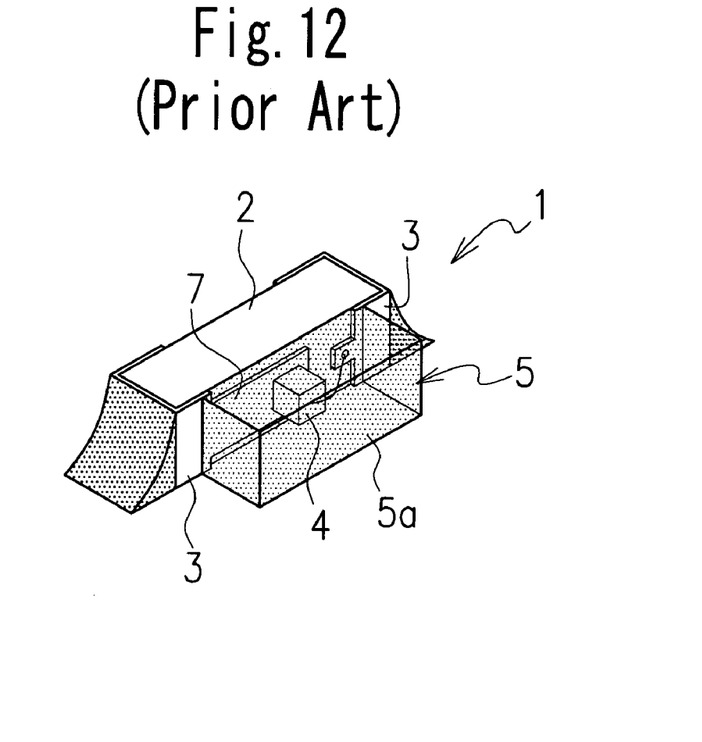
FIG. 12 is a perspective view of a conventional side emission type LED.
Figure 13:
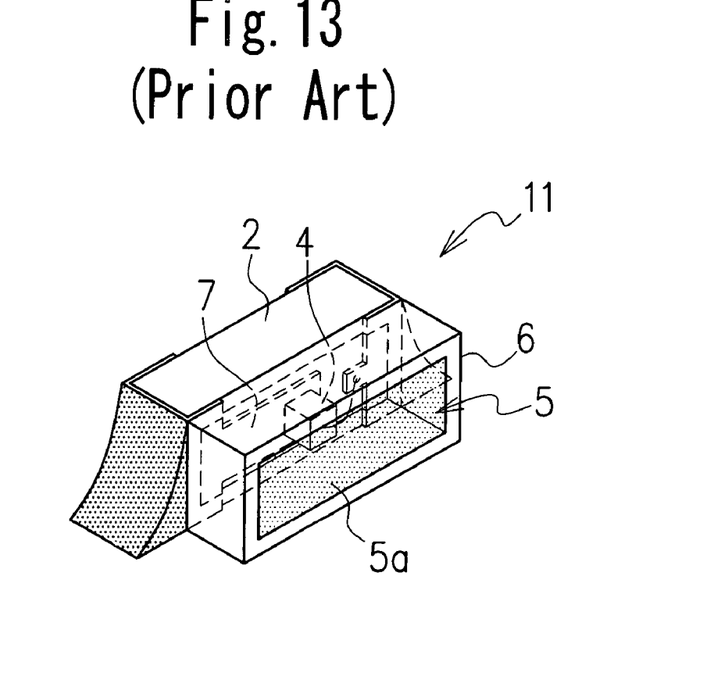
FIG. 13 is a perspective view of another conventional side emission type LED.

As a backlight source to illuminate a display panel such as a liquid crystal display from its side, an LED of a side emission type such as disclosed in Japanese Patent Disclosure No. 2002-368281 has been known. This LED 1, as shown in FIG. 12, comprises a chip substrate 2 formed with a die bond pattern 7 and electrode terminals 3, an LED chip 4 mounted on the die bond pattern 7, and a light transmitting resin body 5 that seals the LED chip 4. An LED 11 shown in FIG. 13 is made by having an LED 1 of the above construction fitted with a reflective frame 6 at its sides except for a light emitting face 5a. The reflective frame 6 collects light emitted from the LED chip 4 toward a light emitting face 5a to concentratedly illuminate a side of a thin liquid crystal panel.

However, because of its construction of FIG. 12, in which the LED chip 4 is mounted on the die bond pattern 7 provided on the side of the chip substrate 2 and is enclosed by and sealed with the light transmitting resin body 5, the LED 1, though it can be reduced in thickness, has the light from the LED chip 4 scattered and therefore is not suited as a backlight source to efficiently illuminate a surface of small width, such as a side face of a liquid crystal panel.

In the LED 11 such as shown in FIG. 13, on the other hand, since the reflective frame 6 is provided around the light transmitting resin body 5 except for the light emitting face 5a, the light emitted from the LED chip 4 does not expand but is focused toward the light emitting face 5a so that a bright light can be emitted to the outside. However, since the reflective frame 6 enclosing the light transmitting resin body 5 has a predetermined thickness, there are cases where it cannot be mounted in a mobile phone on which there are growing demands for smaller thickness.

SUMMARY OF THE INVENTION

An object of this invention is to provide a side emission type light emitting diode (LED) that can be reduced in thickness for surface mounting and which can illuminate a small-width side surface of, for example, a liquid crystal panel with high efficiency.

To achieve the above objective, the LED of this invention comprises: a chip substrate formed with a die bond pattern and electrode terminals; at least one LED chip mounted on the chip substrate; a reflective frame arranged on the chip substrate to enclose a circumference of the LED chip and having an opening at a part of its side walls and on an upper surface; reflecting surfaces formed on inner circumferential surfaces of the side walls of the reflective frame; a light transmissive resin body formed in the reflective frame and using the opening in the side wall as a light emission face; and a reflecting film covering an upper surface of the light transmissive resin body exposed on an upper surface side of the reflective frame; wherein light produced by the LED chip is reflected by a reflecting surface of the refractive frame and by the reflecting film and is emitted outward from the light emission face.

With the LED of this invention, the LED chip mounted on the chip substrate is sealed in the light transmissive resin body which is enclosed around its circumference by a reflective frame except for a part of the side surfaces that constitutes a light emission face of the light transmissive resin body. This construction allows the light emitted from the LED chip toward the sides to be focused toward the light emission face. Further, the provision of the thin reflecting film on the upper surface of the light transmissive resin body enables light emitted from the LED chip upward to be directed toward the light emission face and can also reduce the overall thickness of the LED. This in turn allows the chip to be installed in cell phones that are rapidly decreasing in size.

Further, in this invention it is possible to form a multicolor LED having a plurality of light emitting chips of different colors arranged in line toward the light emission face. By arranging these light emitting chips in line toward the light emission face and providing a reflective frame on the side surfaces of the LED except for the light emission face and a reflecting member on the upper surface of the LED, rays of light emitted from the LED chips of different colors in the light transmissive resin body are mixed together and emitted from the light emission face of LED to the outside.

DETAILED DESCRIPTION OF THE PREFERRED EMBODIMENTS

Referring to the accompanying drawings, preferred embodiments of an LED according to this invention will be described by way of examples.

Figure 1:
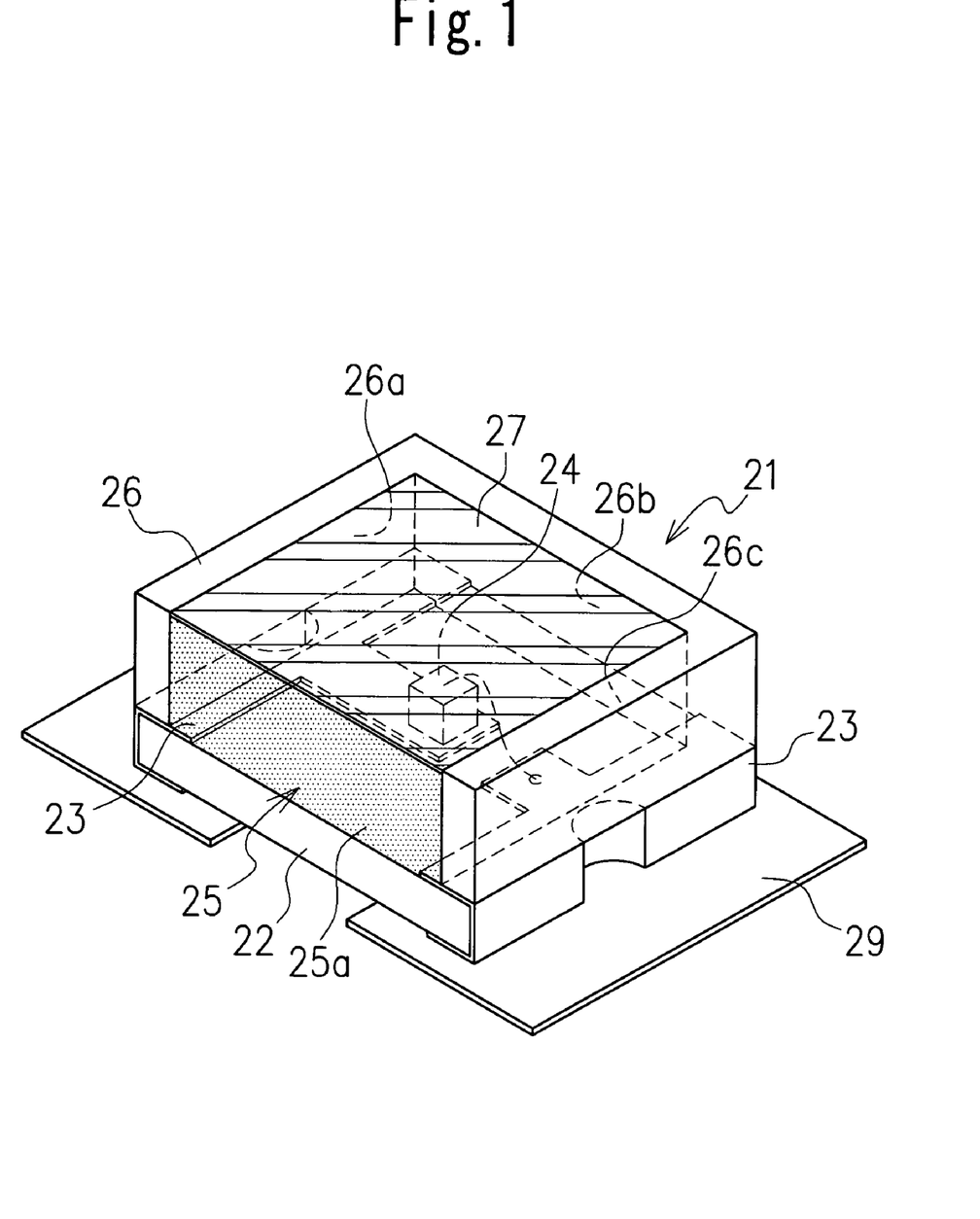
FIG. 1 is a perspective view of a light emitting diode (LED) as a first embodiment of this invention.
Figure 2:
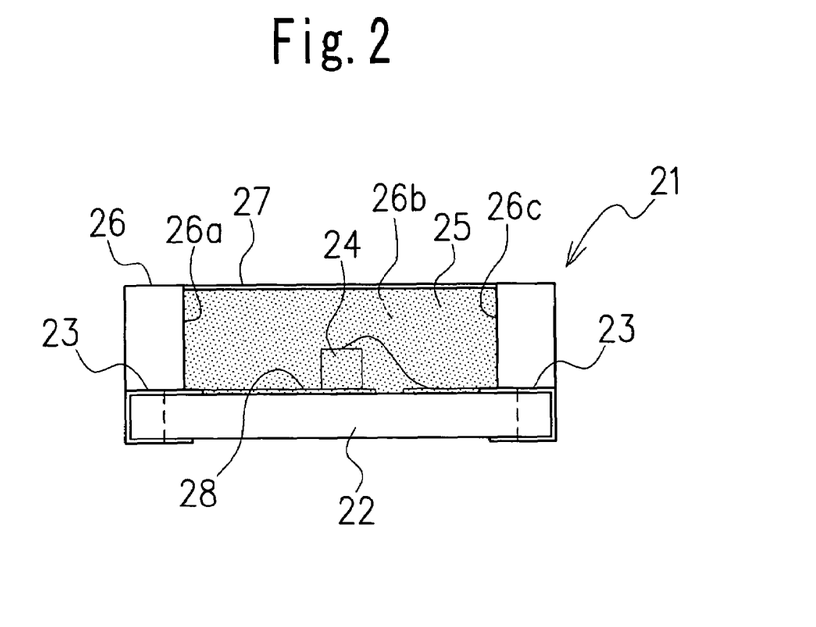
FIG. 2 is a cross-sectional view of the LED of the first embodiment.

FIG. 1 is a perspective view of the LED of the first embodiment of the invention; FIG. 2 is a cross-sectional view of the LED shown in FIG. 1; and FIG. 3 is a plan view of the LED shown in FIG. 1.

Figure 3:
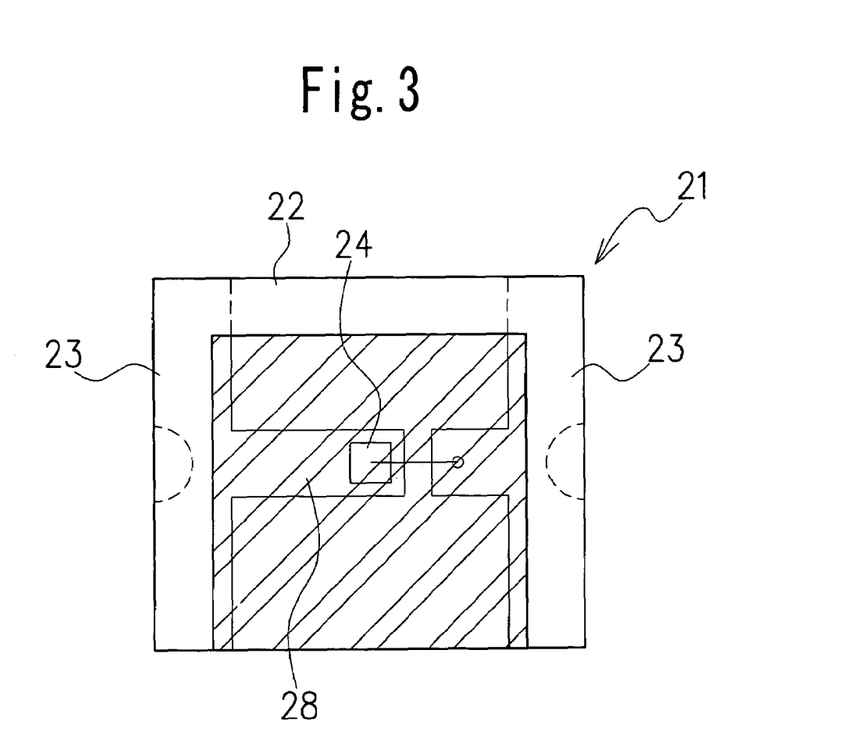
FIG. 3 is a plan view of the LED of the first embodiment.

As shown in FIG. 1 to FIG. 3, the LED 21 of this invention comprises an LED chip 24 mounted on a chip substrate 22 formed by glass epoxy or BT resin (bismaleimide triazine resin), a light transmissive resin body 25 that seals the LED chip 24 on the chip substrate 22, a reflective frame 26 enclosing the light transmissive resin body 25 on three sides, and a reflective film 27 formed over the light transmissive resin body 25. On its three inner sides the reflective frame 26 has reflecting surfaces 26a, 26b, 26c so that light from the LED chip 24 is directed toward a resin surface (light emission face 25a) of the light transmissive resin body 25 which is not enclosed by the reflecting surfaces 26a, 26b, 26c and the reflective film 27.

The chip substrate 22 is provided with electrode terminals 23 to make electrical connections with a die bond pattern 28, on which the LED chip 24 is mounted, and with a mounting substrate 29. The LED chip 24 is a minute square chip having a pair of electrodes (anode and cathode) on its upper and lower surfaces and which is made of such materials as GaAsP, GaP and GaN. The electrode on the lower surface is connected by die bonding to the die bond pattern 28 and the electrode on the upper surface is wire-bonded to the electrode terminal 23 that opposes the die bond pattern 28.

The light transmissive resin body 25 is formed into a three-dimensional shape by filling into a space on the chip substrate 22 containing the LED chip 24 at the center an epoxy or silicon-based resin material, which is transparent or has a translucency tinged with white. The reflective frame 26 is a molded resin member containing a highly reflective material such as particles of titanium oxide or other metal particles. Or it may be a formed metal member having a reflective plating on the surface. It is shaped like a letter U to enclose the light transmissive resin body 25 on the three sides. On the upper surface of the light transmissive resin body 25 is formed a thin metal reflective film 27 that is made by deposition, plating or transfer.

The LED 21, as shown in FIG. 1, is positioned by directing the light emission face 25a in a predetermined direction, putting the back of the chip substrate 22 on the electrode pattern of the mounting substrate 29, such as mother board, and performing reflow processing for solder connection.

In the LED 21 of the above construction, a voltage is applied between the left and right electrode terminals 23, 23 to cause the LED chip 24 mounted at the center of the chip substrate 22 to directly emit light toward the light emission face 25a. At the same time the light reflected by the reflecting surfaces 26a, 26b, 26c on the inner side of the reflective frame 26 is also emitted from the light emission face 25a toward the outside. Since the upper surface of the light transmissive resin body 25 is covered with the reflective film 27, the light emitted upward from the LED chip 24 does not leak out but is reflected back to the reflecting surfaces 26a, 26b, 26c and the reflected light is also emitted from the light emission face 25a. As described above, the light produced by the LED chip 24 can be efficiently focused toward the light emission face 25a, so an area facing the light emission face 25a can be brightly illuminated with high concentration.

Further, since the upper surface of the light transmissive resin body 25 is covered with the thin reflective film 27, the height of the LED 21 can be minimized, allowing it to be mounted in thin devices such as cell phones with a narrow mounting space.

Figure 4:
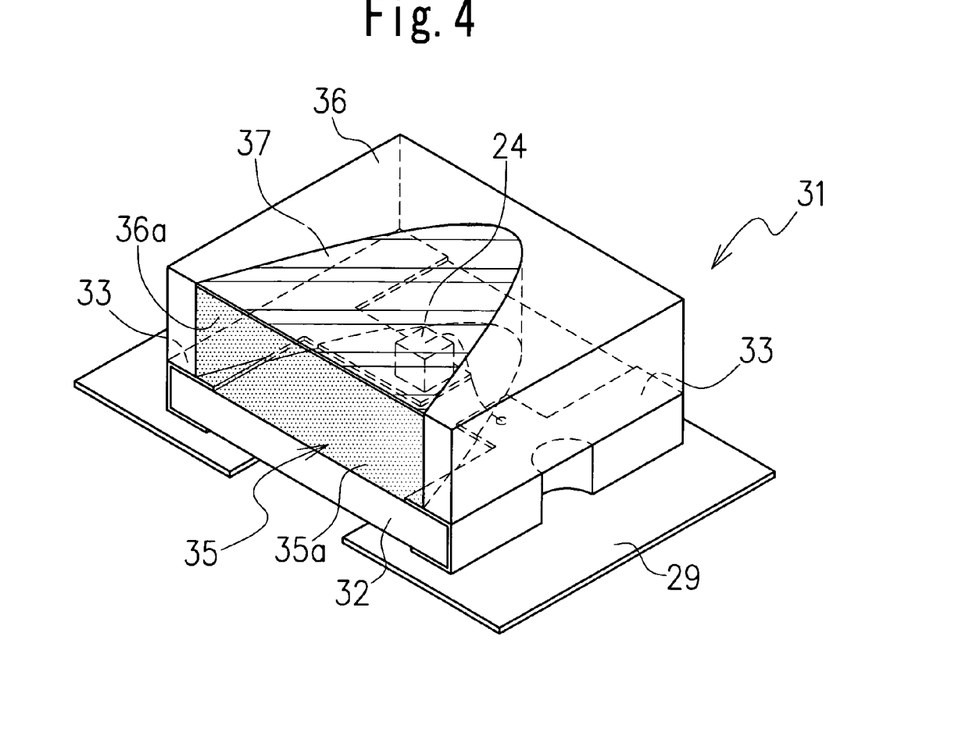
FIG. 4 is a perspective view of an LED as a second embodiment of this invention.
Figure 5:
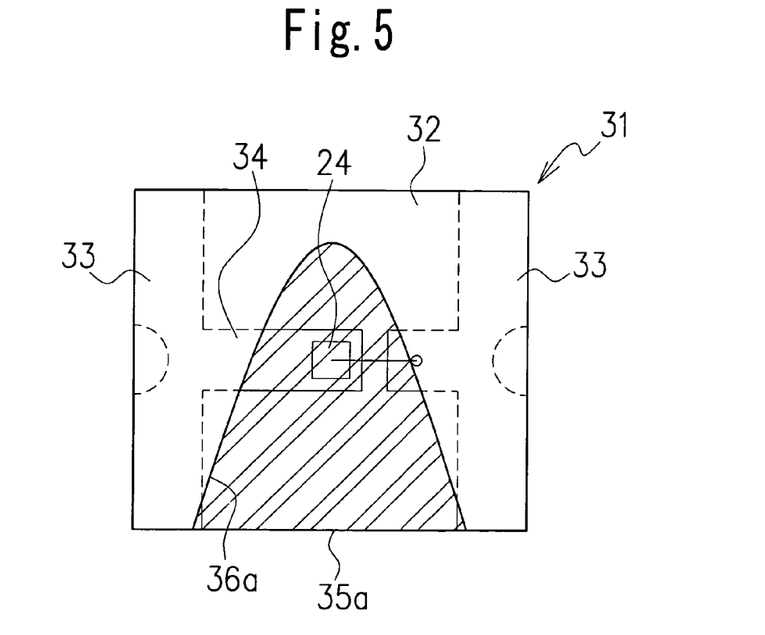
FIG. 5 is a plan view of the LED of the second embodiment.

FIG. 4 and FIG. 5 show an LED 31 of a second embodiment. This LED 31 comprises a chip substrate 32 formed with a die bond pattern 34, on which the LED chip 24 is mounted, and electrode terminals 33; a reflective frame 36 mounted on the chip substrate 32 and formed with a recessed portion to seal the LED chip 24 therein; and a transmissive resin body 35 filled in the recessed portion. The recessed portion is formed like a letter U, with its inner circumferential surface constituting a reflecting surface 36a that reflects light emitted from the LED chip 24. Further, the transmissive resin body 35 filled in the recessed portion is formed with a reflective film 37, similar to the one of the first embodiment, on the exposed upper surface thereof, with an exposed part of the transmissive resin body 35 on one side of the reflective frame 36 forming a light transmission face 35a.

In the LED 31 of the above construction, the light directly emitted from the LED chip 24 toward the light transmission face 35a and the light reflected by a reflecting surface 36a, whose reflection angle is so set as to focus light toward the light transmission face 35a, and by the reflective film 37 formed on the upper surface of the transmissive resin body 35 combine to concentratedly illuminate the front side of the light transmission face 35a. Therefore, compared with the LED 21 of the first embodiment, the LED of the second embodiment is more suitably applied to a backlight source that illuminates a focused area with high brightness.

Figure 6:
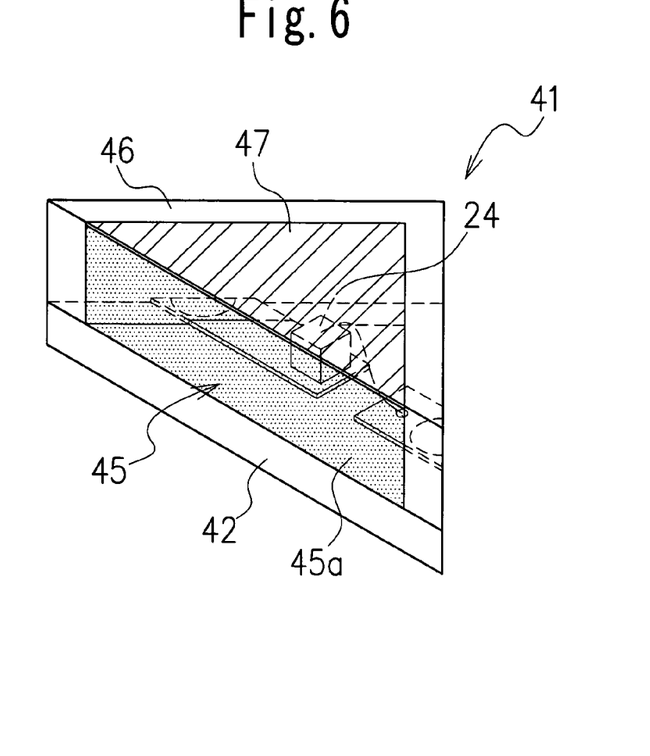
FIG. 6 is a perspective view of an LED as a third embodiment of this invention.
Figure 7:
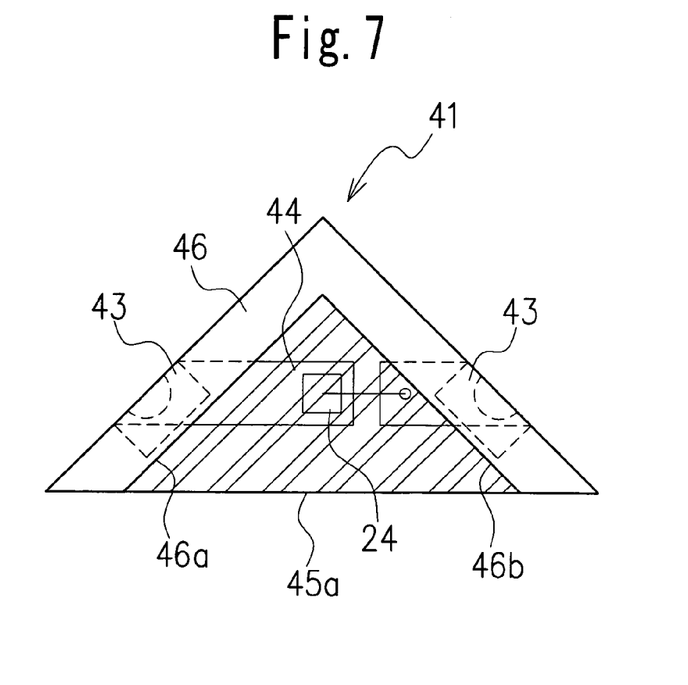
FIG. 7 is a plan view of the LED of the third embodiment.

FIG. 6 and FIG. 7 show an LED of a third embodiment of this invention. This LED 41 comprises a triangular chip substrate 42 formed with a die bond pattern 44, on which the LED chip 24 is mounted, and electrode terminals 43; an L-shaped reflective frame 46 mounted on two sides of the chip substrate 42 and having two reflecting surfaces 46a, 46b; and a light transmissive resin body 45 filled in the reflective frame 46. The light transmissive resin body 45 has a reflective film 47 similar to the one of the first embodiment formed on the exposed upper surface thereof, with a part of the light transmissive resin body 45 on one side of the reflective frame 46 forming a light emission face 45a.

In the LED 41 of the above construction, the light directly emitted from the LED chip 24 toward the light emission face 45a and the light reflected by the reflecting surfaces 46a, 46b toward the light emission face 45a combine to illuminate the front of the light emission face 45a concentratedly. In this embodiment, since the reflecting surfaces 46a, 46b are open toward left and right spanning the light emission face 45a, a wide range of area around the light emission face 45a can be illuminated.

Figure 8:
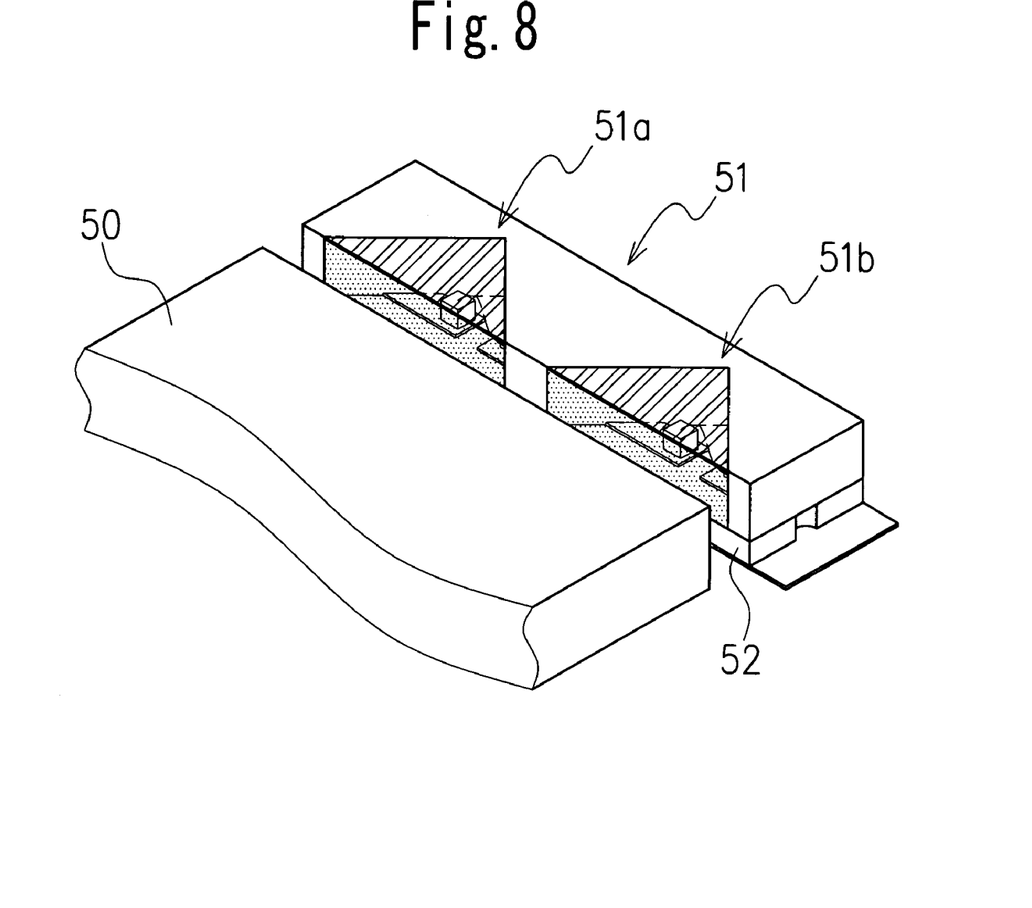
FIG. 8 is a perspective view of an LED as a fourth embodiment of this invention.
Figure 9:
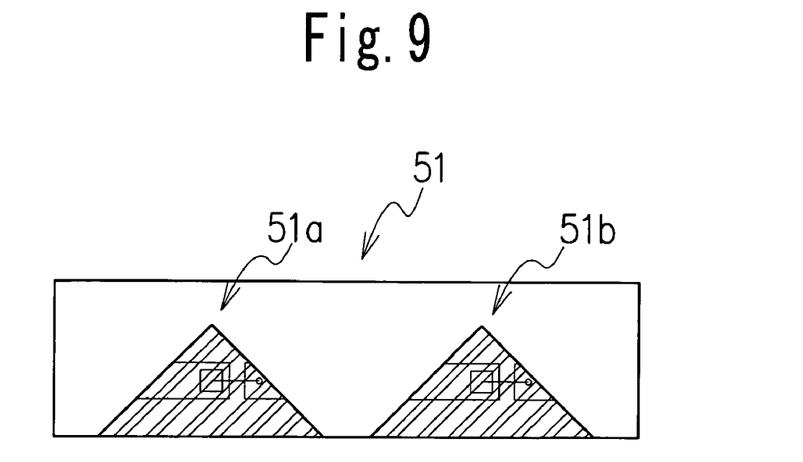
FIG. 9 is a plan view of the LED of the fourth embodiment.

FIG. 8 and FIG. 9 show an LED 51 as a fourth embodiment of this invention which has two light emitting portions 51a, 51b arranged side by side on and formed integral with a single chip substrate 52 formed to the size of a side surface of, for instance, a liquid crystal panel 50 to be illuminated. The construction of the light emitting portions 51a, 51b is similar to that of the LED 41 of the third embodiment and its explanation is omitted here. By arranging these light emitting portions in a straight light and forming them as an integral unit, it is possible to uniformly illuminate a liquid crystal panel of a large display size at a high luminance level. In this embodiment, while two light emitting portions 51a, 51b are used, the number and the arrangement interval of the light emitting portions may be changed according to the shape and size of the liquid crystal panel to be illuminated.

Figure 10:
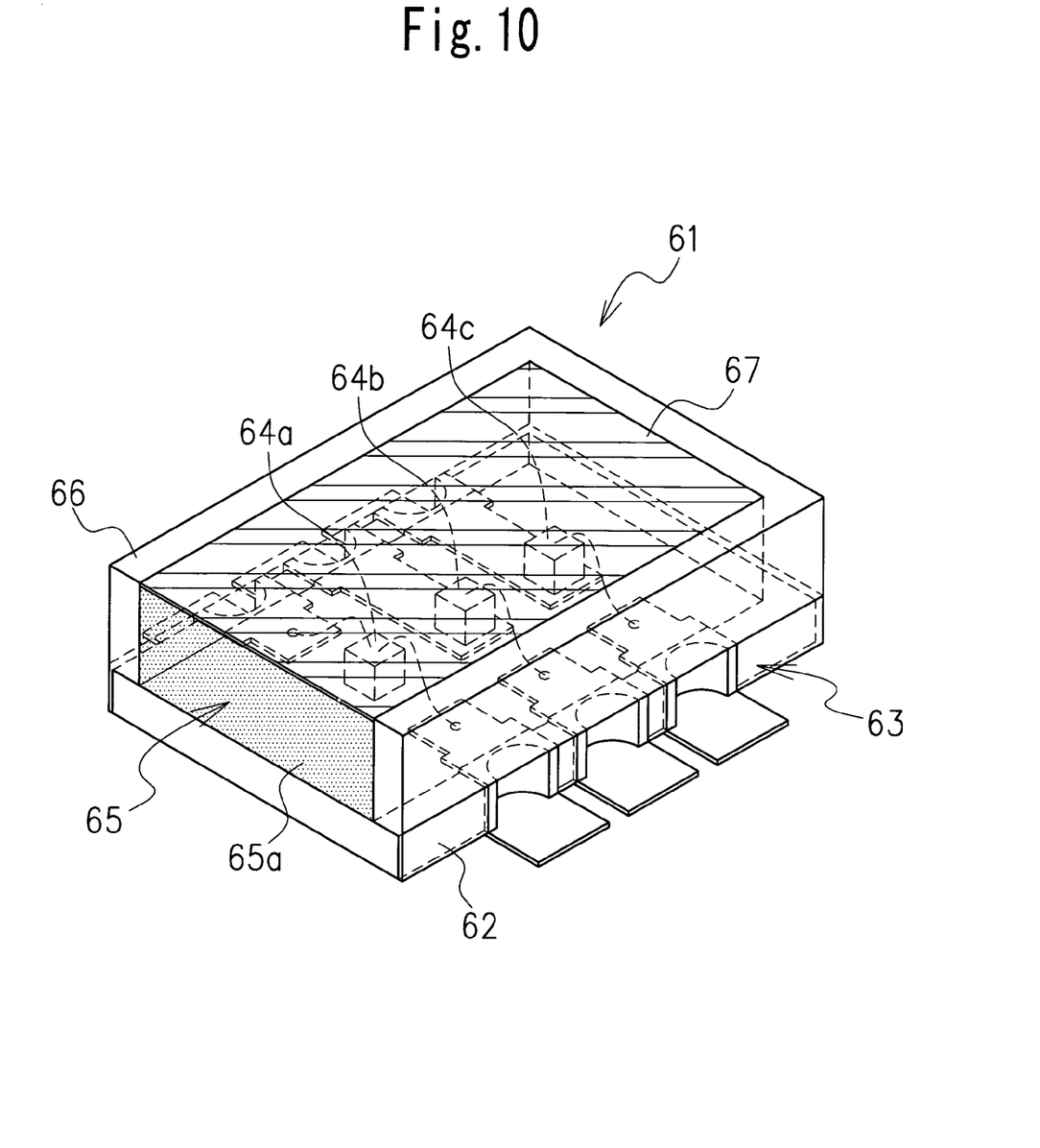
FIG. 10 is a perspective view of an LED as a fifth embodiment of this invention.
Figure 11:
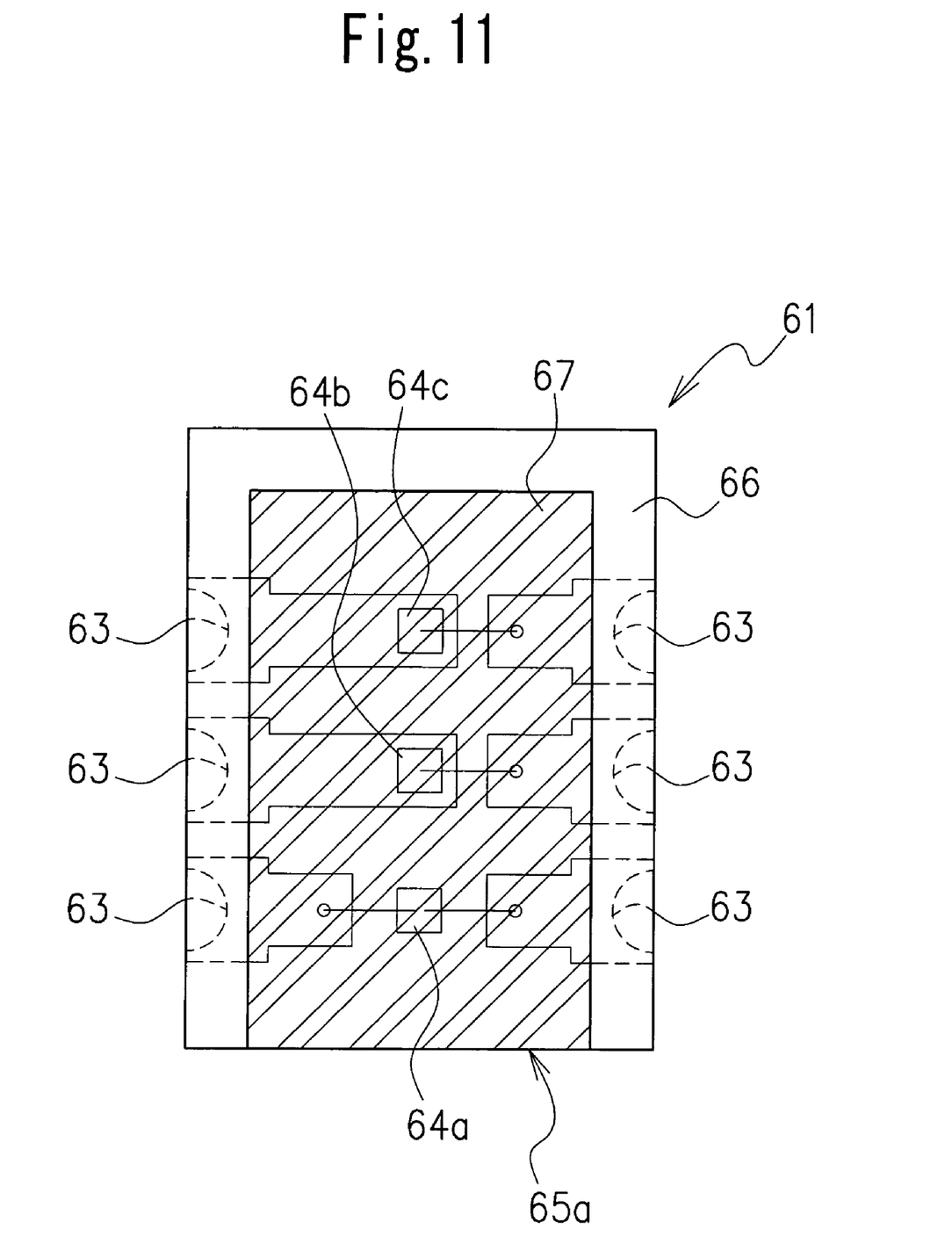
FIG. 11 is a plan view of the LED of the fifth embodiment of this invention.

FIG. 10 and FIG. 11 illustrate an LED 61 according to a fifth embodiment of this invention. This LED 61 has a blue LED chip 64a, a green LED chip 64b and a red LED chip 64c and can emit light of multiple colors. These LED chips are mounted side by side on a chip substrate 62 which has three sets of paired electrode terminals 63, each made up of anode and cathode. They are sealed with a light transmissive resin body 65. The light transmissive resin body 65 is enclosed by a reflective frame 66 on its three sides and provided with a reflective film 67 on its upper surface.

The arrangement of the LED chips is as follows. As shown in FIG. 10 and FIG. 11, the red LED chip 64c is put at the deepest position in a space enclosed by the reflective frame 66, with the green LED chip 64b and the blue LED chip 64a arranged toward a light emission face 65a in that order. As described above, by placing the near-transparent LED chips, such as green and blue LED chips 64b, 64a, closer to the light emission face 65a, the light produced by the red LED chip 64c placed on the farther side is allowed to pass through the light transmissive resin body 65 and go out from the light emission face 65a efficiently without being attenuated. Also, adding a fluorescent material such as YAG in the light transmissive resin body 65 can realize a white LED with an excellent color rendering capability.

The LED with its light transmissive resin body enclosed by the reflective frame on three sides and exposed on one side, as described in the above embodiments, is formed in the following process. If, for example, two of the LED such as shown in the first embodiment are formed at the same time, two sets of paired electrode terminals and two LED chips associated with the paired electrode terminals are mounted on a single collective chip substrate. Then, the reflective frame is attached to the outer circumference of the collective chip substrate and a transparent resin is filled in the reflective frame to form a light transmissive resin body. Next, a reflecting film is formed on the upper surface of the light transmissive resin body to form a collective LED. After this, the collective LED is divided in half at an almost intermediate point between the two LED chips. Now, two LEDs are made at the same time, each having one side of the light transmissive resin body exposed as the light emission face.

What is claimed is:

1. A light emitting diode comprising:
   a chip substrate;
   at least one light emitting diode chip electrically mounted on the chip substrate;
   a light transmissive resin body having a side surface and an upper surface, the resin body being provided on the chip substrate to cover the light emitting diode chip;
   a reflective frame covering a first part of the side surface of the resin body and leaving at least a second part of the side surface and the upper surface uncovered; and
   a thin reflecting film covering the upper surface of the light transmissive resin body,
   wherein the second part of the side surface that is not covered by the reflective frame is configured to form at least one light emission face.

2. A light emitting diode according to claim 1, wherein the reflective frame has a U-shaped reflecting surface that encloses the first part of the side surface of the light transmissive resin body covering the light emitting diode chip except for the at least second part of the side surface that is not covered by the reflective frame.

3. A light emitting diode according to claim 1, wherein the reflective frame has a plurality of light emission faces of a plurality of independent light transmissive resin bodies, each of which is formed to be exposed from the reflective frame so that the light emission faces are directed in the same direction.

4. A light emitting diode according to claim 1, wherein the reflective frame is selected from the group consisting of: a molded resin member containing reflective particles, a formed metal member, and a molded resin member provided with a reflective plating on its surface.

5. A light emitting diode according to claim 1, wherein the reflecting film is a thin metal film or coated film covering on the upper surface of the light transmissive resin body.

6. A light emitting diode according to claim 1, wherein the light emitting diode chip is made up of a plurality of light emitting diode chips of different illumination colors arranged in line on the chip substrate to emit light toward the light emission face.

7. A light emitting diode according to claim 6, wherein the light emitting diode chip is made up of a green light emitting diode chip, a blue light emitting diode chip and a red light emitting diode chip.

8. A light emitting diode according to claim 7, wherein the red light emitting diode chip is disposed at a position farthest from the light emission face.

9. A light emitting diode according to claim 1, wherein the light emitting diode chip is a blue light emitting diode chip which is sealed in a light transmissive resin body containing phosphor pigments to produce a white light.

10. A light emitting diode according to claim 1, wherein the reflective frame has a V-shaped reflecting surface that encloses the first part of the side surface of the light transmissive resin body covering the diode chip except for the at least second part of the side surface that is not covered by the reflective frame.

11. A light emitting diode according to claim 1, wherein the reflective frame has an arc-shaped reflecting surface that encloses the first part of the side surface of the light transmissive resin body covering the diode chip except for the at least second part of the side surface that is not covered by the reflective frame.

12. A light emitting diode according to claim 1, wherein the upper surface of the light transmissive resin body is covered only by the thin reflecting film.

\* \* \* \* \*